(12) United States Patent
Shimizu

(10) Patent No.: US 7,133,797 B2
(45) Date of Patent: Nov. 7, 2006

(54) METHOD, APPARATUS, SYSTEM, PROGRAM AND MEDIUM FOR INSPECTING A CIRCUIT BOARD AND AN APPARATUS INCORPORATING THE CIRCUIT BOARD

(75) Inventor: Takehiko Shimizu, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 117 days.

(21) Appl. No.: 10/952,831

(22) Filed: Sep. 30, 2004

(65) Prior Publication Data

US 2005/0071102 A1    Mar. 31, 2005

(30) Foreign Application Priority Data

Sep. 30, 2003   (JP)   ............................. 2003-340381

(51) Int. Cl.
*G06F 19/00*   (2006.01)

(52) U.S. Cl. .................. 702/117; 702/81; 702/189; 714/30; 714/733; 324/73.1; 324/500; 324/765; 382/145

(58) Field of Classification Search ................ 702/117, 702/124, 189, 81, 57; 714/30, 733; 324/73.1, 324/500, 537, 765; 382/145
See application file for complete search history.

(56) References Cited

U.S. PATENT DOCUMENTS

| | | | |
|---|---|---|---|
| 5,894,528 A | | 4/1999 | Yasumi et al. |
| 6,889,348 B1 * | | 5/2005 | Sato ............................ 714/724 |
| 6,921,672 B1 * | | 7/2005 | Satya et al. .................... 438/18 |
| 2002/0029123 A1 * | | 3/2002 | Miyatake et al. ........... 702/117 |
| 2002/0078266 A1 | | 6/2002 | Watanabe et al. |
| 2003/0102882 A1 * | | 6/2003 | Seo et al. .................... 324/765 |

FOREIGN PATENT DOCUMENTS

| | | |
|---|---|---|
| JP | 01-100474 | 4/1989 |
| JP | 2001-235505 | 8/2001 |

OTHER PUBLICATIONS

Usami et al., 'Semiconductor Inspection System for Next-generation', Jan. 2000, Hitachi Review, vol. 49, No. 4, pp. 216-219.*
Runyon et al., 'Embedded Edge: Practical solutions for DSP System Developers', Oct. 2000, Texas Instruments Publication, pp. 2-35, especially, pp. 20-24.*
Ockunzzi et al., 'Test Strategies for BIST at the Algorithmic and Register-Transfer Levels', Jan. 2002, NSF Publication, pp. 1-6.*
Crane et al., 'Tackling Advanced Technology Boards: Combining X-Ray and ICT', Sep. 1999, Agilent Technology Publication, pp. 1-4.*

* cited by examiner

*Primary Examiner*—Marc S. Hoff
*Assistant Examiner*—Elias Desta
(74) *Attorney, Agent, or Firm*—Oblon, Spivak, McClelland, Maier & Neustadt, P.C.

(57) ABSTRACT

A method, apparatus, system, computer program and medium, for inspecting a wide variety of circuit boards. A controller generates test data and reference data according to characteristic information of a circuit board. Using the test data, the circuit board generates processed data. A comparator compares the processed data with the reference data on a bit-by-bit basis. Based on the comparison result, the comparator determines acceptability of the circuit board. In addition, the comparator is capable of specifying a specific portion of the circuit board causing a defect.

61 Claims, 12 Drawing Sheets

METHOD, APPARATUS, SYSTEM, PROGRAM AND MEDIUM FOR INSPECTING A CIRCUIT BOARD AND AN APPARATUS INCORPORATING THE CIRCUIT BOARD

BACKGROUND OF THE INVENTION

1. Field of the Invention

The present invention relates to a technique of inspecting a circuit board and an apparatus incorporating the circuit board, and more particularly to a method, apparatus, system, computer program and medium, for determining acceptability of a circuit board and an apparatus incorporating the circuit board.

2. Discussion of the Background

To determine acceptability of a circuit board or an apparatus incorporating the circuit board, an inspecting apparatus is usually connected to the circuit board or to the apparatus.

In one example, the inspecting apparatus inputs test data to the circuit board and compares processed data output by the circuit board with predetermined reference data. Based on the comparison result, the inspecting apparatus inspects the acceptability of the circuit board, and further, the acceptability of the apparatus.

In another example, the inspecting apparatus inputs test data to the apparatus and compares, visually, processed data output by the apparatus with predetermined reference data.

However, any one of the above methods is not capable of identifying whether the cause of a defect is attributable to the circuit board or to the apparatus, since the inspection is based on either one of the circuit board and the apparatus. Further, when the circuit board includes a plurality of functional blocks, it is difficult to specify the actual functional block causing a defect.

In addition to the above-described drawbacks, a conventional inspecting apparatus has a problem in compatibility. To provide test data and reference data suitable to the circuit board or the apparatus to be inspected, the inspecting apparatus is generally manufactured for each type of the circuit board or the apparatus. Thus, a general-purpose inspecting apparatus capable of inspecting a wide variety of inspected items is desired.

SUMMARY OF THE INVENTION

In view of the foregoing, it is an object of the present invention to provide a technique of inspecting a circuit board and an apparatus incorporating the circuit board, capable of specifying the cause of a defect.

It is another object of the present invention to provide a technique of inspecting a wide variety of circuit boards and apparatuses.

In one example, such a technique may be realized, using a novel inspecting apparatus for inspecting acceptability of an inspected item.

The novel inspecting apparatus includes a controller, a storage device, a test data input device, a reference data input device, a test data output device, a processed data input device, an address manager, and a data comparator.

The controller provides a test data set including at least one test data, and a reference data set including at least one reference data. These data sets may be generated by the controller itself or any other apparatus connected to the controller via a network, for example, as long as they are generated corresponding to characteristic information obtained from the inspected item.

The storage device has a first data area, a second data area, and a third data area.

The test data input device extracts the test data from the controller and stores it in the first data area of the storage device. At the same time, the reference data input device extracts the reference data from the controller and stores it in the second data area of the storage device.

The test data output device extracts the test data from the first data area, and provides it to the inspected item. The inspected item then generates processed data, using the test data.

The processed data input device receives the processed data from the inspected item, and stores it in the third data area of the storage device.

The address manager obtains address information, indicating the respective locations of the test data in the first data area, the reference data in the second data area, and the processed data in the third data area, and stores them for future reference.

The data comparator extracts the processed data and the corresponding reference data from the storage device, using the address information for comparison. Based on the comparison result, the data comparator can determine the acceptability of the inspected item.

In addition to the above-described operation, the novel inspecting apparatus may convert the test data and the processed data, when the inspected item operates with a bit-width different from that of the novel inspecting apparatus.

In another example, the novel inspecting apparatus may compare the processed data with the reference data, in a wide variety of bit-width options.

In another example, the novel inspecting apparatus may determine the acceptability of the inspected item, based on the number of defects detected. For example, the inspected item may be determined to be defective, when the number of defects exceeds a predetermined value.

In yet another example, the novel inspecting apparatus may identify a specific portion of the inspected item causing the defect, using the address information.

In addition to the novel inspecting apparatus just described, this patent specification may be implemented in many other specific forms, including as a system, method, computer program and medium, as will be apparent to those skilled in the relevant art(s), without departing from the spirit or scope of the invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
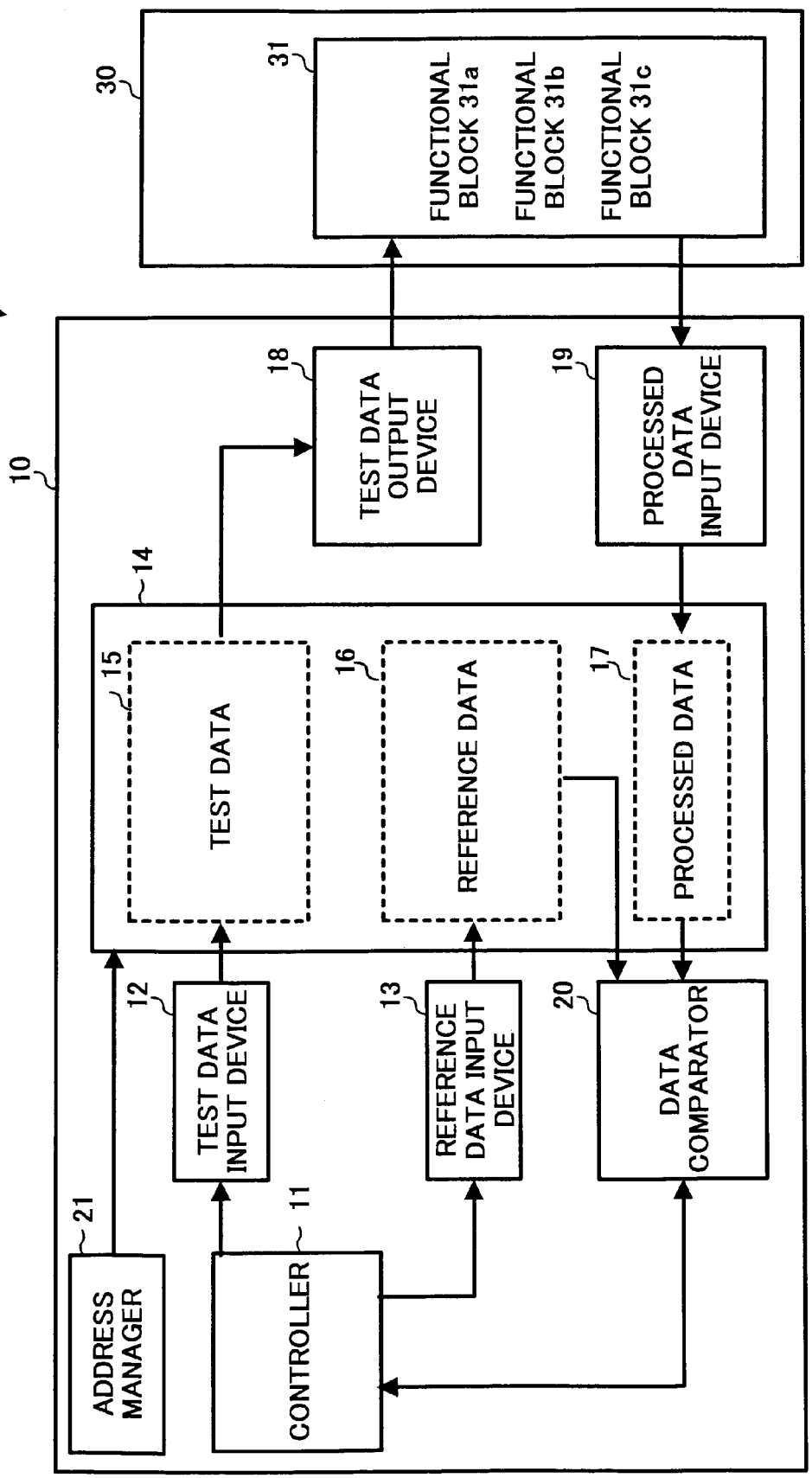
FIG. 1 is a schematic block diagram illustrating a structure of an inspecting system according to a preferred embodiment of the present invention.

In describing preferred embodiments illustrated in the drawings, specific terminology is employed for the sake of clarity. However, the disclosure of this patent specification is not intended to be limited to the specific terminology selected and it is to be understood that each specific element includes all equivalents that operate in a similar manner. Referring now to the drawings, wherein like reference numerals designate identical or corresponding parts throughout the several views, particularly to FIG. 1, a description is made of an inspecting system 1 according to a preferred embodiment of the present invention.

The inspecting system 1 includes an inspected apparatus 30 having a circuit board 31, and an inspecting apparatus 10, capable of inspecting the acceptability of the circuit board 31. Further, the inspecting apparatus 10 may determine the acceptability of the inspected apparatus 30 based on the acceptability of the circuit board 31.

The circuit board 31 has a plurality of functional blocks, with each block having a specific function. The overall function of the functional blocks determines the characteristics of the circuit board 31. The number of functional blocks depends on the type of circuit board; however, the circuit board 31 of FIG. 1 is assumed to include three functional blocks 31a, 31b, and 31c for the illustrative purpose.

The inspecting apparatus 10 includes a controller 11, a test data input device 12, a reference data input device 13, a memory 14, a test data output device 18, a processed data input device 19, a data comparator 20, and an address manager 21. The memory 14 includes a test data area 15, a reference data area 16, and a processed data area 17.

In operation, the controller 11 obtains information regarding the characteristics (characteristic information) of the inspected apparatus 30, and generates a set of test data and reference data according to the characteristic information of the inspected apparatus 30. The characteristic information includes, for example, information regarding the structure of the circuit board 31, such as the number of pins.

The test data input device 12 stores the test data in the test data area 15 of the memory 14. The reference data input device 13 stores the reference data in the reference data area 16 of the memory 14. At the same time, the address manager 21 obtains address information of the test data and the reference data, respectively. The address information specifies, for example, the actual location and the data length of the test data and the reference data.

The test data output device 18 takes out the test data from the test data area 15 and sends it to the circuit board 31 of the inspected apparatus 30. The circuit board 31 generates processed data corresponding to the received test data, using the functional blocks 31a to 31c.

The processed data input device 19 receives the processed data output from the circuit board 31, and stores it in the processed data area 17 of the memory 14. At the same time, the address manager 21 obtains address information of the processed data.

The data comparator 20 compares the processed data with the reference data on a bit-by-bit basis, using the address information stored in the address manager 21. The data comparator 20 then determines the acceptability of the circuit board 31 based on the comparison result. More specifically, if the processed data matches with the reference data, the data comparator 20 determines that the circuit board 31 is acceptable. Further, the data comparator 20 may determine that the inspected apparatus 30 incorporating the circuit board 31 is acceptable, if the circuit board 31 is acceptable.

The data comparator 20 outputs the determination result to the controller 11. The controller 11 may display the determination result on a display device (not shown) connected to the controller 11. Alternatively, the controller 11 may record the determination result onto a recording sheet, using a printer (not shown) connected to the controller 11.

In this way, the inspecting system 1 can inspect a wide variety of circuit boards, without changing the structure of the inspecting apparatus 10.

Figure 2:
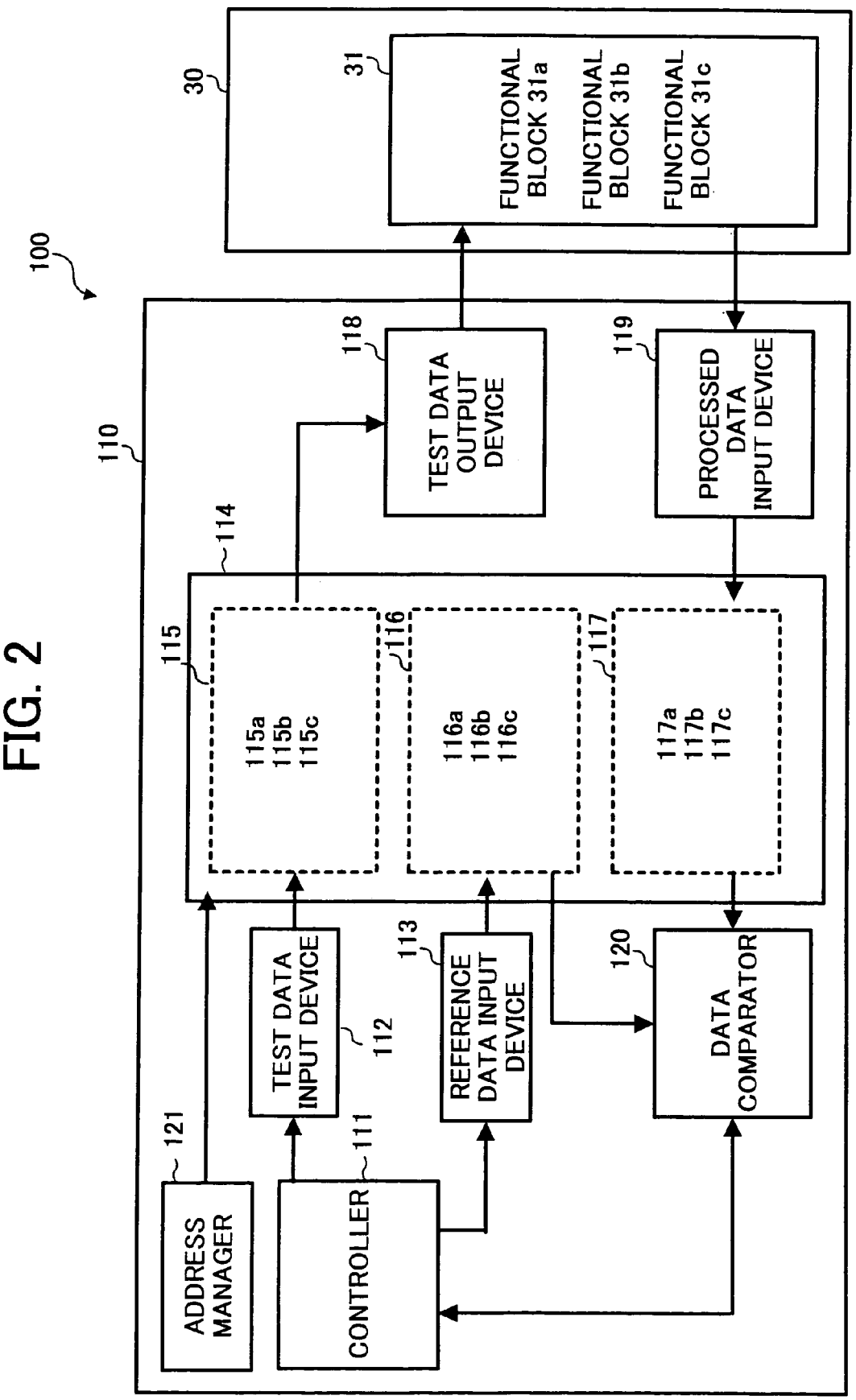
FIG. 2 is a schematic block diagram illustrating a structure of an inspecting system according to another preferred embodiment of the present invention.

FIG. 2 illustrates an inspecting system 100, according to another preferred embodiment of the present invention.

The inspecting system 100 includes the inspected apparatus 30 having the circuit board 31, and an inspecting apparatus 110, capable of inspecting the acceptability of the respective functional blocks 31a to 31c. Further, the inspecting apparatus 110 may determine the acceptability of the circuit board 31 and/or the inspected apparatus 30, based-on the acceptability of the functional blocks 31a to 31c.

As shown in FIG. 2, the inspecting apparatus 110 includes a controller 111, a test data input device 112, a reference data input device 113, a memory 114, a test data output device 118, a processed data input device 119, a data comparator 120, and an address manager 121. The memory 114 includes a test data area 115, a reference data area 116, and a processed data area 117.

Referring to FIG. 2, an exemplary case of inspecting the acceptability of the respective functional blocks 31a to 31c is explained.

The controller 111 obtains characteristic information of the functional blocks 31a to 31c, respectively. The controller 111 then generates a set of test data 115a and reference data 116a corresponding to the functional block 31a, a set of test data 115b and reference data 116b corresponding to the functional block 31b, and a set of test data 115c and reference data 116c corresponding to the functional block 31c.

The test data input device 112 stores the test data 115a to 115c in the test data area 115 of the memory 114. The reference data input device 113 stores the reference data 116a to 116c in the reference data area 116 of the memory 114. At the same time, the address manager 121 obtains address information of the test data 115a to 115c and the reference data 116a to 116c, respectively.

The test data output device 118 takes out the test data 115a to 115c, and inputs the test data 115a, 115b, and 115c to the functional blocks 31a, 31b, and 31c, respectively.

The functional blocks 31a, 31b, and 31c generate processed data 117a, 117b, and 117c, respectively, and output the processed data 117a, 117b, and 117c to the processed data input device 119.

The processed data input device 119 stores the processed data 117a to 117c in the processed data area 117 of the memory 114.

The data comparator 120 compares the processed data 117a, 117b, and 117c, respectively with the reference data 116a, 116b, and 116c, on a bit-by-bit basis. In this case, the data comparator 120 may use the address information stored in the address manager 121. Based on the comparison results, the data comparator 120 determines the acceptability of the respective functional blocks 31a, 31b, and 31c. More specifically, if the processed data 117a matches with the reference data 116a, the data comparator 120 determines that the functional block 31a is acceptable. If the processed data 117b matches with the reference data 116b, the data comparator 120 determines that the functional block 31b is acceptable. If the processed data 117c matches with the reference data 116c, the data comparator 120 determines that the functional block 31c is acceptable.

The data comparator 120 outputs the determination results to the controller 111. The controller 111 may display or record the determination results, in a similar manner described referring to FIG. 1.

In this way, the inspecting system 100 can inspect the acceptability of each of the functional blocks 31a to 31c incorporated in the circuit board 31.

Instead of inspecting all the functional blocks 31a to 31c of the circuit board 31, the inspecting apparatus 110 may inspect only one or two of the three functional blocks 31a to 31c.

For example, if the functional block 31a is selected for inspection, the controller 111 may only generate the set of the test data 115a and the reference data 116a. Alternatively, the controller 111 may generate additional sets of test data and reference data for the functional blocks 31b and 31c, and store them in the memory 114 via the test data input device 112 or the reference data input device 113.

In other words, the amount of data to be generated by the controller 111 depends on various factors of the inspecting system 100, such as the number of functional blocks for inspection and the available memory space of the memory 114, for example.

Further, when inspecting the functional block 31a, the test data output device 118 may select a set of the test data 115a and the reference data 116a, using the address information stored in the address manager 121.

Figure 3:
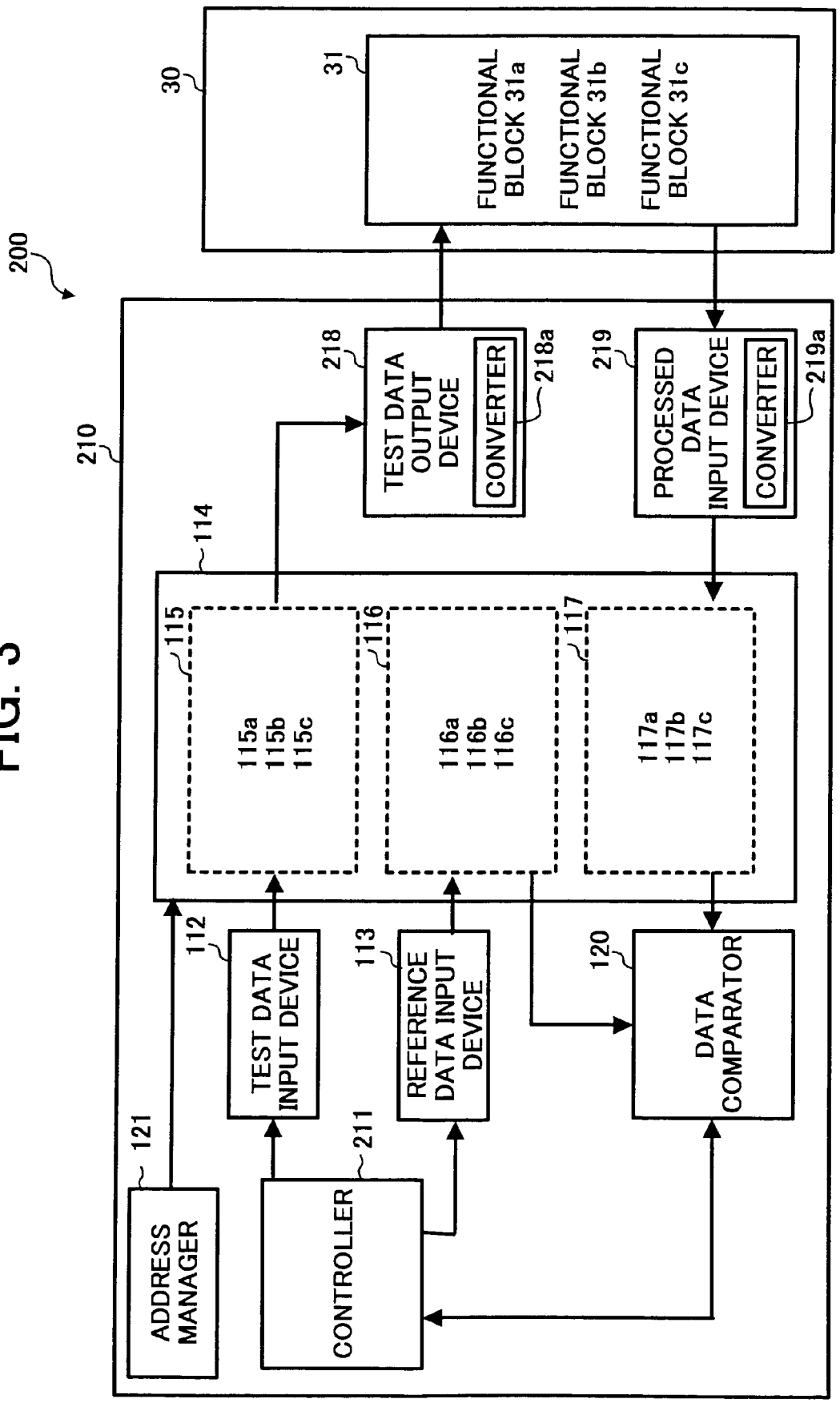
FIG. 3 is a schematic block diagram illustrating a structure of an inspecting system according to another preferred embodiment of the present invention.

FIG. 3 illustrates an inspecting system 200, according to another preferred embodiment of the present invention.

The inspecting system 200 of FIG. 3 is substantially similar in structure to the inspecting system 100 of FIG. 2, except for an inspecting apparatus 210. More specifically, a controller 211, a test data output device 218, and a processed data input device 219 have structures different from the corresponding devices of the inspecting apparatus 110 of FIG. 2.

In addition to the operation described referring to FIG. 2, the inspecting apparatus 210 performs data conversion, using converters 218a and 219a.

For example, if the memory 114 includes a 64-bit SDRAM (Synchronous Dynamic Random Access Memory), and the circuit board 31 operates on bits lower than 64 bits, the converter 218a converts 64-bit test data to lower-bit test data. Similarly, the converter 219a converts lower-bit processed data to 64-bit processed data.

Figure 4:
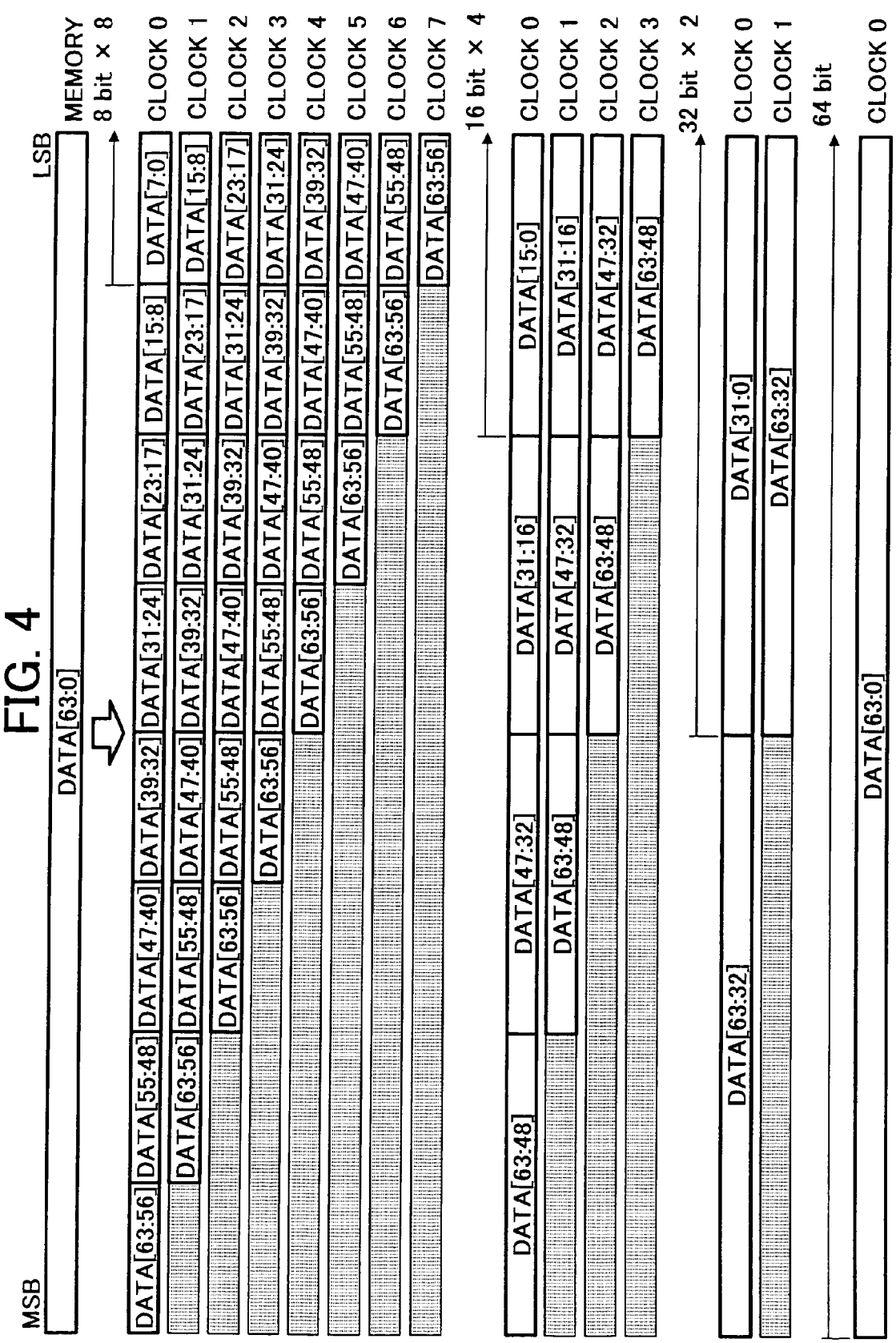
FIG. 4 is a schematic diagram illustrating an operation of converting test data, performed by the inspecting system of FIG. 3.

FIG. 4 illustrates three exemplary cases of converting 64-bit test data to lower-bit test data, performed by the converter 218a. Specifically, FIG. 4 illustrates the cases of converting to 8-bit test data, to 16-bit test data, and to 32-bit test data.

Now, a general operation of converting 64-bit test data is explained with reference to FIG. 4.

After reading 64-bit test data from the test data area 115, the converter 218a obtains information regarding the bit-width ("bit-width information") of the circuit board 31 from the controller 211. In this example, the controller 211 previously stores such bit-width information as a part of the characteristic information. The bit-width may be defined as a maximum number of bits allocated to represent numerical quantities.

Based on the bit-width information, the converter 218a divides the 64-bit test data into a number of smaller data segments.

The converter 218a then outputs each data segment at each clock cycle, until all the data segments are output to the circuit board 31.

For example, if the circuit board 31 operates on 8 bits, the converter 218a divides the 64-bit test data into eight data segments, as shown in FIG. 4. The first data segment is output to the circuit board 31 at the first clock ("CLOCK 0"). The second data segment is output to the circuit board 31 at the second clock ("CLOCK 1"). This process is repeated until the last data segment is output to the circuit board 31 at the eighth clock ("CLOCK 7").

Similarly, if the circuit board 31 operates on 16 bits, the converter 218a divides the 64-bit test data into four data segments, as shown in FIG. 4. Further, if the circuit board 31 operates on 32 bits, converter 218a divides the 64-bit test data into two data segments, as shown in FIG. 4.

After the conversion, the lower-bit test data are output to the circuit board 31, and lower-bit processed data are generated.

Figure 5:
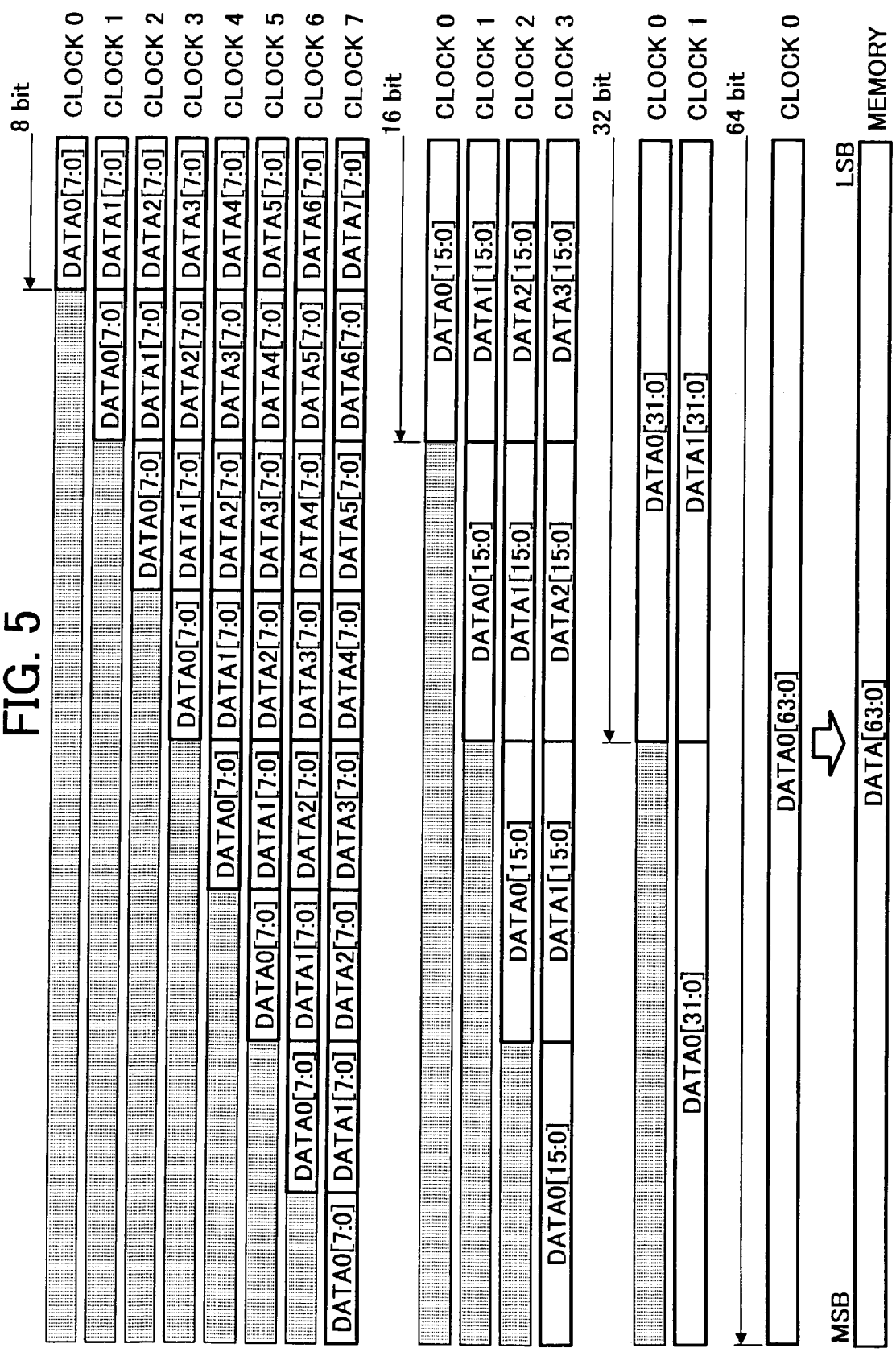
FIG. 5 is a schematic diagram illustrating an operation of converting processed data, performed by the inspecting system of FIG. 3.

Referring now to FIG. 5, a general operation of converting lower-bit processed data to 64-bit processed data is explained.

FIG. 5 illustrates three exemplary cases of converting lower-bit processed data to 64-bit processed data, performed by the converter 219a. Specifically, FIG. 5 illustrates the cases of converting 8-bit processed data, 16-bit processed data, and 32-bit processed data.

The converter 219a receives lower-bit processed data, bit by bit, from the circuit board 31, and stores the bits of the processed data in a registry (not shown). If the amount of the bits stored in the registry reaches 64 bits, the converter 219a forms the stored bits of processed data into 64-bit processed data, and sends it to the memory 114 at once.

For example, if the circuit board 31 operates on 8 bits, the converter 219a accumulates 8-bit processed data in the registry, until the accumulated bits reach 64 bits.

This increases overall performance of the inspecting system 200.

In any one of the above examples, the test data, the reference data, and the processed data are generated, respectively. Any of such data may be expressed as signals, patterns, and/or images, etc., as long as the processed data and the reference data are comparable.

For example, any one of the above-described inspecting systems may additionally include a pattern generator. The pattern generator is capable of generating pattern data, which may be used as the test data and/or the reference data. In such a case, the circuit board 31 generates processed pattern data.

Further, in any one of the above-described inspecting systems, a set of test data and reference data may be generated by the controller according to characteristic information received from the inspected apparatus. However, the controller may obtain such data sets from the outside of the inspecting system.

In one example, the controller may obtain data sets from an apparatus incorporating a master circuit board, which functions normally.

Figure 6:
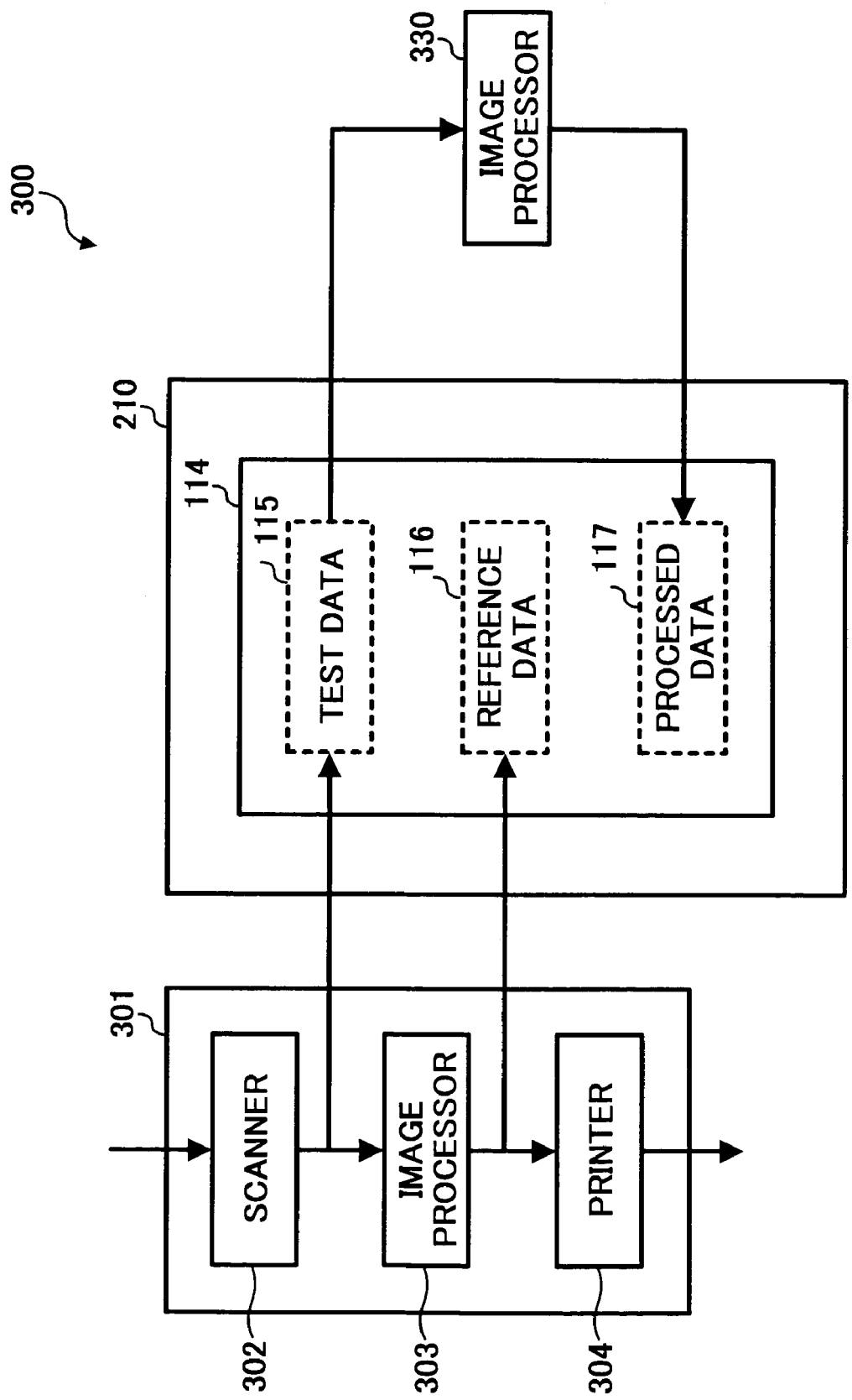
FIG. 6 is a schematic block diagram illustrating a structure of an inspecting system according to another embodiment of the present invention.

FIG. 6 illustrates an inspecting system 300 according to another preferred embodiment of the present invention. The inspecting system 300 includes an image forming apparatus 301, the inspecting apparatus 210, and a target image processor 330. In this example, the inspecting system 300 uses the inspecting apparatus 210, however, it may use any one of the above-described and other inspecting apparatuses according to the present invention.

The inspecting apparatus 210 inspects the acceptability of the target image processor 330, using data sets generated by the image forming apparatus 301.

The image forming apparatus 301, which operates normally, includes a scanner 302, an image processor 303, and a printer 304.

As shown in FIG. 6, the output terminal of the scanner 302 is connected to the input terminal of the test data area 115 of the memory 114. The output terminal of the test data area 115 is connected to the input terminal of the target image processor 330. The output terminal of the target image processor 330 is connected to the input terminal of the processed data area 117. The output terminal of the image processor 303 is connected to the input terminal of the reference data area 116 of the memory 114.

In operation, the inspecting apparatus 210 obtains test data generated by the scanner 302, stores it in the test data area 115, and outputs it to the target image processor 330.

Using this test data, the target image processor 330 generates processed data, and stores it in the processed data area 117.

In addition, the inspecting apparatus 210 obtains reference data generated by the image processor 303, and stores it in the reference data area 116.

The inspecting apparatus 210 compares the processed data stored in the processed data area 117 with the reference data stored in the reference data area 116. Based on the comparison result, the inspecting apparatus 210 determines acceptability of the target image processor 330.

Further, in this operation, the processed data may be output to the printer 304, to print the actual processed data for visual inspection.

Using this configuration, the target image processor 330 and the image processor 303 may be compared under the substantially same environment.

Figure 7:
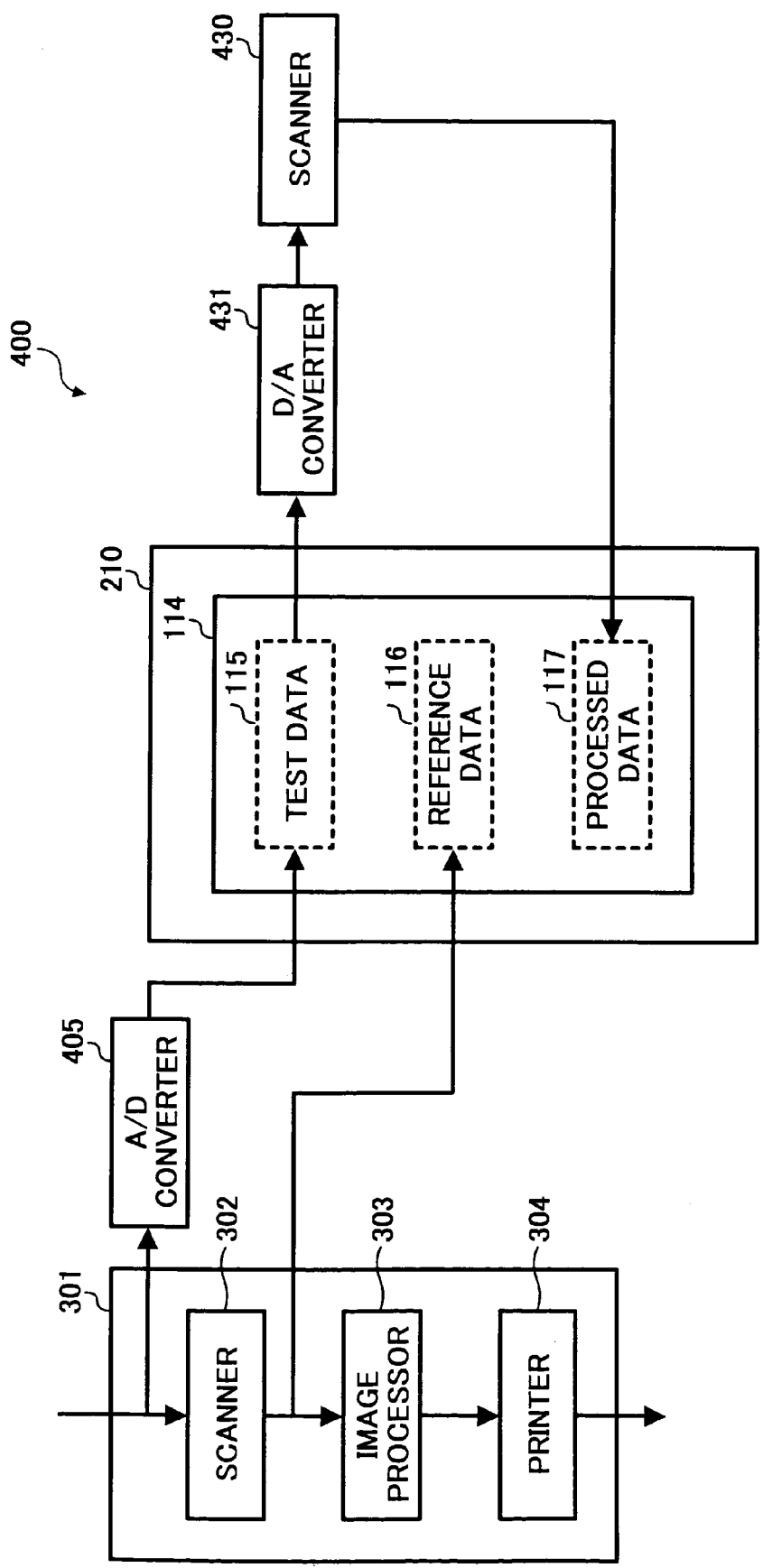
FIG. 7 is a schematic block diagram illustrating a structure of an inspecting system according to another embodiment of the present invention.

FIG. 7 illustrates an inspecting system 400 according to another preferred embodiment of the present invention. The inspecting system 400 is substantially similar to the inspecting system 300, except that a target scanner 430 is provided for inspection instead of the target image processor 330. Since the target scanner 430 uses analog data, an A/D (analog-to-digital) converter 405 and a D/A (digital-to-analog) converter 431 are additionally provided.

In operation, the inspecting apparatus 210 obtains test data to be used by the scanner 302, converts the test data from analog to digital, and stores it in the test data area 115. The test data is then output to the target scanner 430, after being converted from digital to analog by the D/A converter 431.

Using this test data, the target scanner 430 generates processed data, and stores it in the processed data area 117.

In addition, the inspecting apparatus 210 obtains reference data generated by the scanner 302, and stores it in the reference data area 116.

The inspecting apparatus 210 compares the processed data stored in the processed data area 117 with the reference data stored in the reference data area 116. Based on this comparison result, the inspecting apparatus 210 determines the acceptability of the target scanner 430.

Further, in this operation, the processed data may be output to the input terminal of the image processor 303, and further to the printer 304. In this way, the actual processed data may be recorded for visual inspection.

Figure 8:
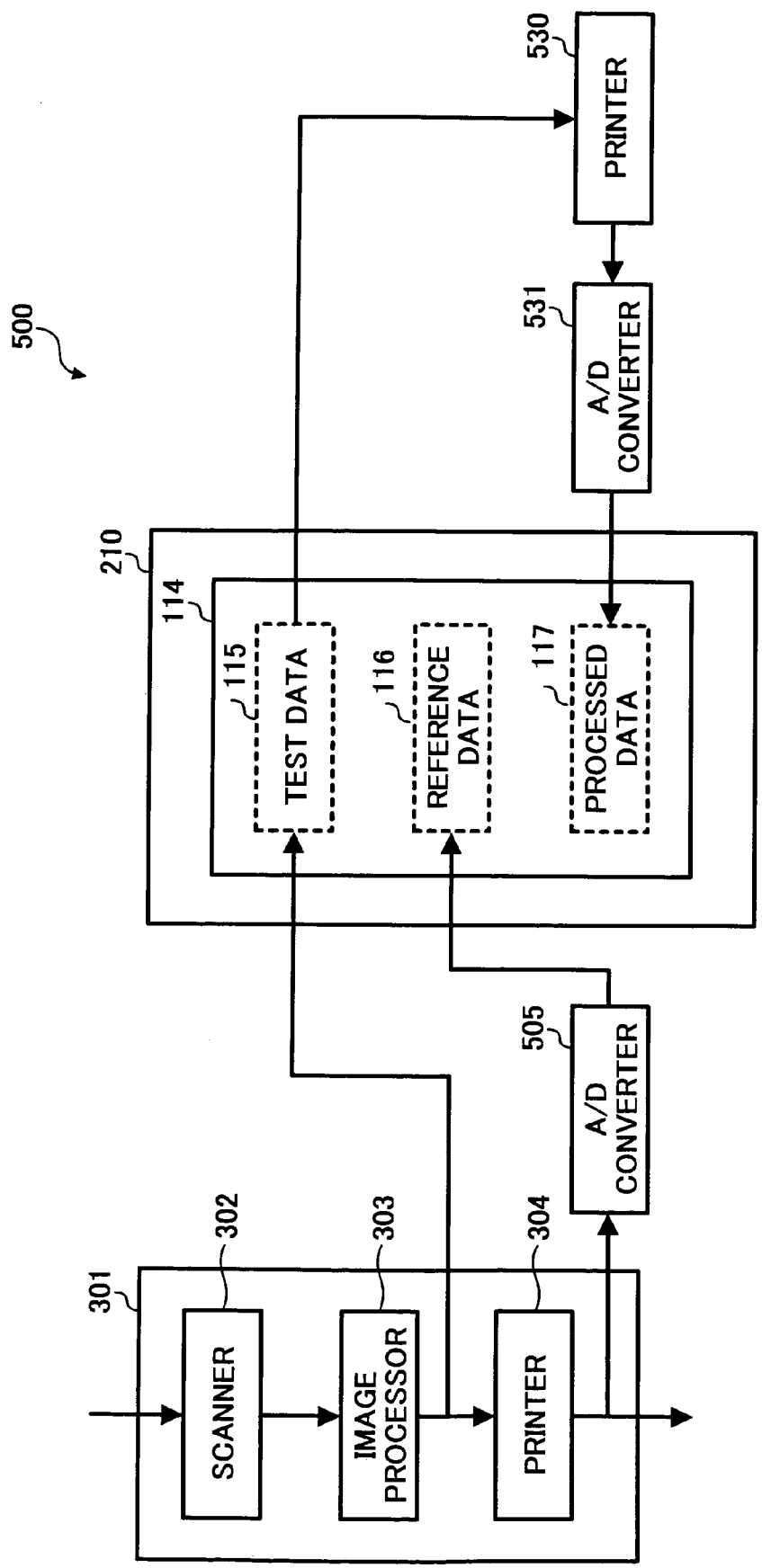
FIG. 8 is a schematic block diagram illustrating a structure of an inspecting system according to another embodiment of the present invention.

FIG. 8 illustrates an inspecting system 500 according to another preferred embodiment of the present invention. The inspecting system 500 is substantially similar to the inspecting system 400, except that a target printer 530 is provided for inspection instead of the target scanner 430. Since the target printer 530 also uses analog data, A/D converters 505 and 531 are provided, in replace of the A/D converter 405 and the D/A converter 431.

In operation, the inspecting apparatus 210 obtains test data to be used by the printer 304, stores it in the test data area 115, and outputs it to the target printer 530.

Using this test data, the target printer 530 generates processed data, and stores it in the processed data area 117 after converting it from analog to digital via the A/D converter 531.

In addition, the inspecting apparatus 210 obtains reference data generated by the printer 304, and stores it in the reference data area 116 after converting it from analog to digital via the A/D converter 505.

The inspecting apparatus 210 compares the processed data stored in the processed data area 117 with the reference data stored in the reference data area 116. Based on this comparison result, the inspecting apparatus 210 determines the acceptability of the target printer 530.

In this operation, the processed data may be directly output as analog data without the conversion, and compared, visually, with the analog reference data.

As mentioned above, any kind of apparatus may be connected to the inspecting system, as long as it functions as a master board for the inspected circuit board.

In another example, the controller may obtain data sets, as a data file, from the outside of the inspecting system.

Figure 9:
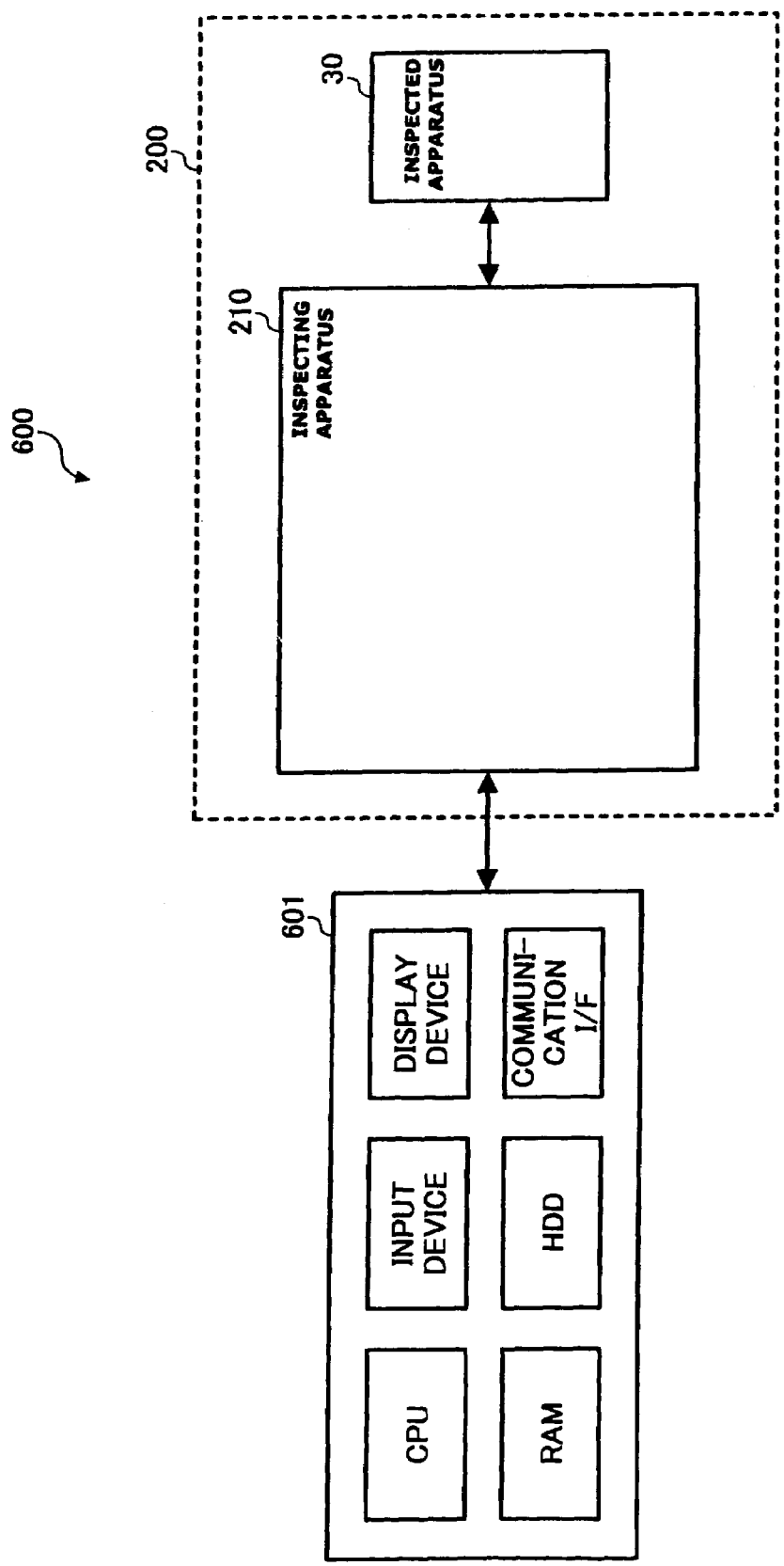
FIG. 9 is a schematic block diagram illustrating a structure of an inspecting system according to another embodiment of the present invention.

FIG. 9 illustrates an inspecting system 600, in which a host apparatus 601 is connected to the inspecting system 200 of FIG. 3. In this exemplary case, the host apparatus 601 generates a set of test data and reference data according to the characteristic information of the inspected apparatus 30. The host apparatus 601 may be connected to any one of the above-described and other inspecting systems of the present invention.

Referring to FIG. 9, the host apparatus 601 mainly includes a CPU (central processing unit), an input device, a display device, a RAM (random access memory), a HDD (hard disk drive), and a communication I/F (interface).

The CPU controls the entire operation of the host apparatus 601. The input device allows a user to input commands to the CPU, and includes a keyboard and a mouse, for example. The display device displays various information output from the CPU, and includes a liquid crystal display, for example. Particularly, in this example, the display device may display the comparison and/or determination results generated by the comparator 120 of the inspecting apparatus 210. The RAM works as a work memory used by the CPU, for example. The HDD stores various programs, including a program used for inspecting the inspected apparatus 30, and a data file including the data sets to be used by the inspecting apparatus 210. The communication I/F allows two-way communications with other apparatuses, such as the inspecting apparatus 210, via a network.

Figure 10:
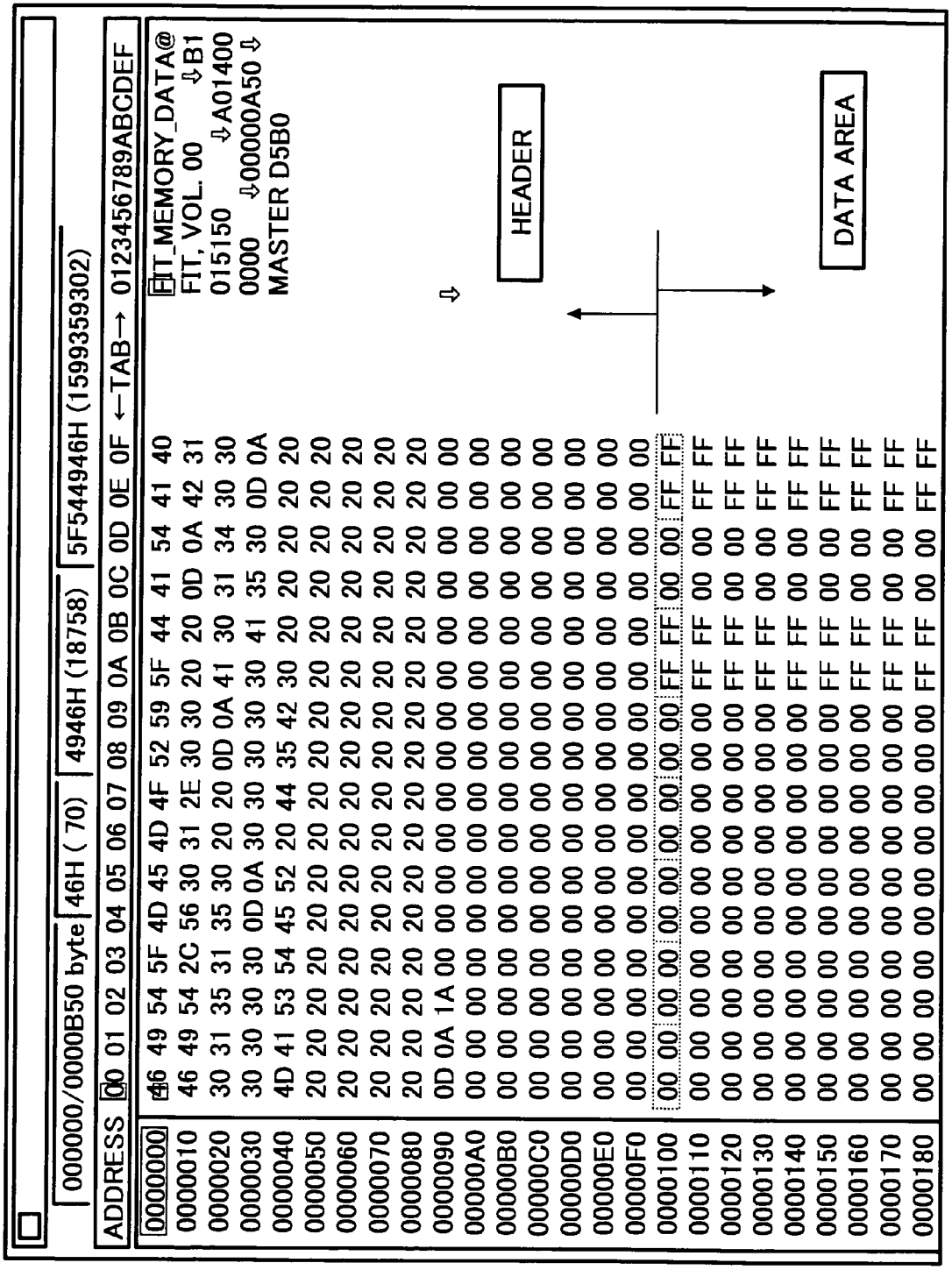
FIG. 10 is an exemplary data file generated by the inspecting system of FIG. 9.

As mentioned above, the host apparatus 601 is capable of generating the data sets according to the characteristic information of the inspected apparatus 30. FIG. 10 illustrates an exemplary data file generated by the host apparatus 601. As shown in FIG. 10, the data file includes a header section having various information, including the characteristic information, for example. The data file further includes a data area section, including actual data sets and address information of the data sets.

Further, the host apparatus 601 may have a function of determining the bit-width conversion performed by the converters 218a and/or 219a. In other words, the host apparatus 601 partly functions as the controller. Further, the host apparatus 601 may function as an inspection control center, for example, capable of remotely controlling inspection of a wide variety of inspected apparatuses via a network.

As the host apparatus 601, any apparatus incorporating the software program disclosed in the U.S. Patent Application Publication No. 2002/0078266 may be used. The entire disclosure of U.S. Patent Application Publication No. 2002/0078266 is hereby incorporated herein by reference.

Figure 11:
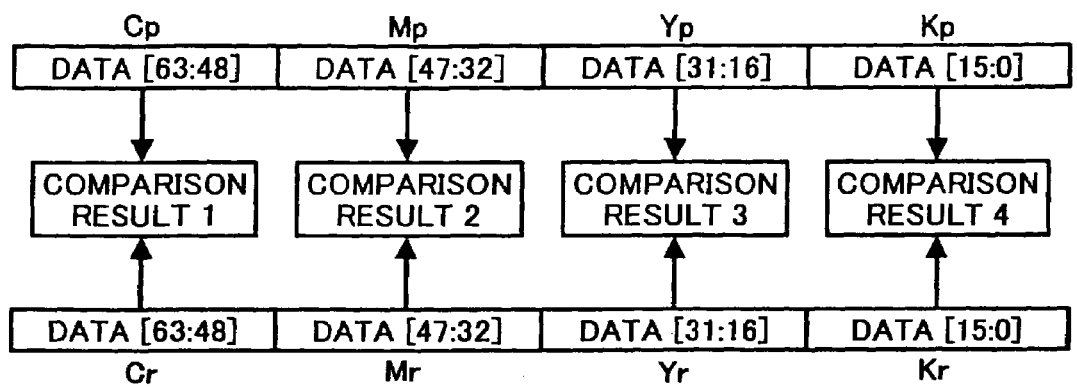
FIG. 11 is a schematic diagram illustrating an exemplary comparison operation performed by any one of the inspecting systems of the present invention.

Referring now to FIG. 11, a general structure and operation of any one of the above-described and other comparators (hereinafter, simply referred to as the "comparator") of the present invention is explained. As mentioned above, the comparator is capable of a wide variety of inspected items, including the inspected apparatus, the circuit board, and the functional blocks (hereinafter, collectively referred to as the "inspected item").

In this exemplary case, a test image having four-color planes is used as test data. The test image includes a cyan test plane, a magenta test plane, a yellow test plane, and a black test plane. For the illustrative purpose, the comparator of FIG. 11 operates with a 16 bit-width.

Corresponding to this test image, reference data having four data segments are generated, as shown in FIG. 11. More specifically, the reference data includes a cyan reference data segment Cr, a magenta reference data segement Mr, a yellow reference data segement Yr, and a black reference data segement Kr.

Further, processed data having four data segments are generated, corresponding to the test image, as shown in FIG. 11. More specifically, the processed data includes a cyan processed data segment Cp, a magenta processed data segment Mp, a yellow processed data segment Yp, and a black processed data segment Kr.

In operation, the comparator extracts the cyan processed data segment Cp and the cyan reference data segment Cr, using the address information stored in the address manager for comparison. The comparator then generates the comparison result 1 having the value of 0 or 1. More specifically, if the cyan processed data segment Cp matches with the cyan reference data segment Cr, the comparison result becomes 0, otherwise, the comparison result becomes 1.

Similarly, the comparator can generate the comparison results 2, 3, and 4, respectively, for the other color data segments. Based on the comparison results 1 to 4, the comparator can determine a specific portion of the inspected item causing an error. For example, if the comparison result 1 has the value 1, the portion controlling a cyan data line has a defect.

In this exemplary case, the comparator compares with a 16-bit basis as mentioned above, however, it may compare with any bit-width. In other words, the comparator may logically divide data into a smaller number of data segments, according to the number of bit-widths defined by the controller or the host apparatus 601.

Further, the comparison results 1 to 4 may be stored in a registry (not shown) provided in the comparator, and used to determine the acceptability of the inspected item.

For example, the number ("error number") of the comparison results assigned with the value 1 may be counted by a counter (not shown) for every comparison performed with a specific bit-width. Using this error number, the comparator can determine the acceptability of the inspected item. For example, if the error number exceeds a predetermined value, the comparator determines that the inspected item has a defect.

In addition to storing the error number, the comparator may store information regarding the actual address at which the error has been detected, for example, the offset address of the error, which specifies the address counted from the address where the comparison starts ("starting address").

Figure 12:
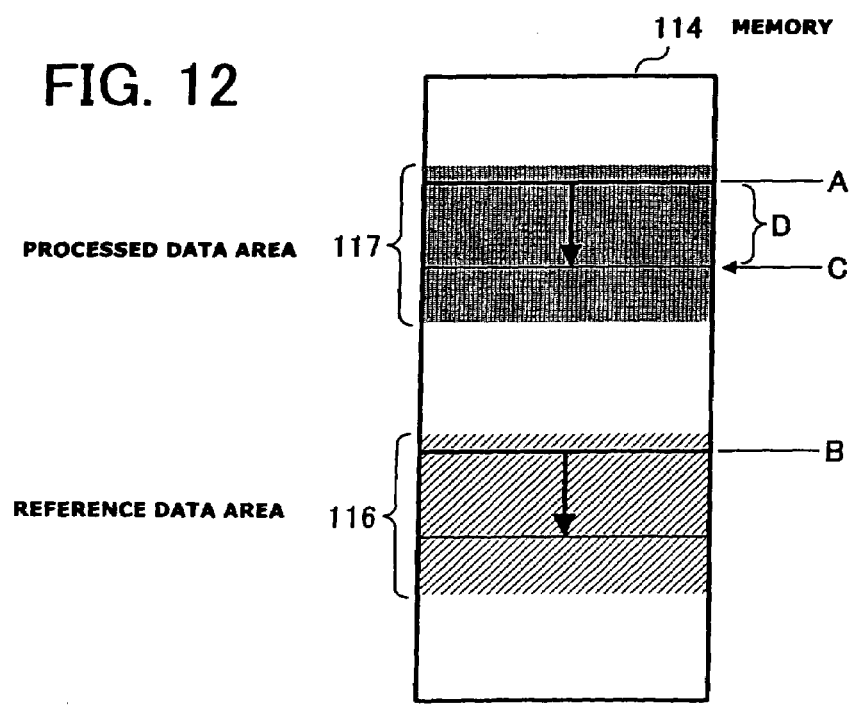
FIG. 12 is a schematic diagram illustrating an exemplary operation of storing a comparison result performed by any one of the inspecting systems of the present invention.

FIG. 12 illustrates an exemplary operation of storing such an offset address in the memory 114.

As shown in FIG. 12, the memory 114 includes the processed data area 117 storing the processed data, and the reference data area 116 storing the reference data.

To compare the processed data and the reference data, bits of the processed data are taken, one by one, from the position A towards the direction indicated by a top arrow. At the same time, bits of the reference data are taken, one by one, from the position B towards the direction indicated by a bottom arrow. In other words, the position A corresponds to the starting address of the processed data.

If the error is detected at the position C, its offset address D, which indicates the address counted from the starting address, is stored in the registry.

Based on the offset address and the starting address, the location of the error can be identified even at a later time.

FIG. 11 illustrates an exemplary case of performing comparison with a 16 bit-width. However, such a comparison may be performed with any bit-width previously set by the controller. In one example, the comparator may compare the processed data and the reference data with a 8 bit-width, a 16 bit-width, a 32 bit-width, and a 64 bit-width, respectively. The comparison results for each bit-width may be stored in the registry, as the error numbers. By referring to the error numbers, the controller may easily determine a portion of the inspected item causing an error.

Figure 13:
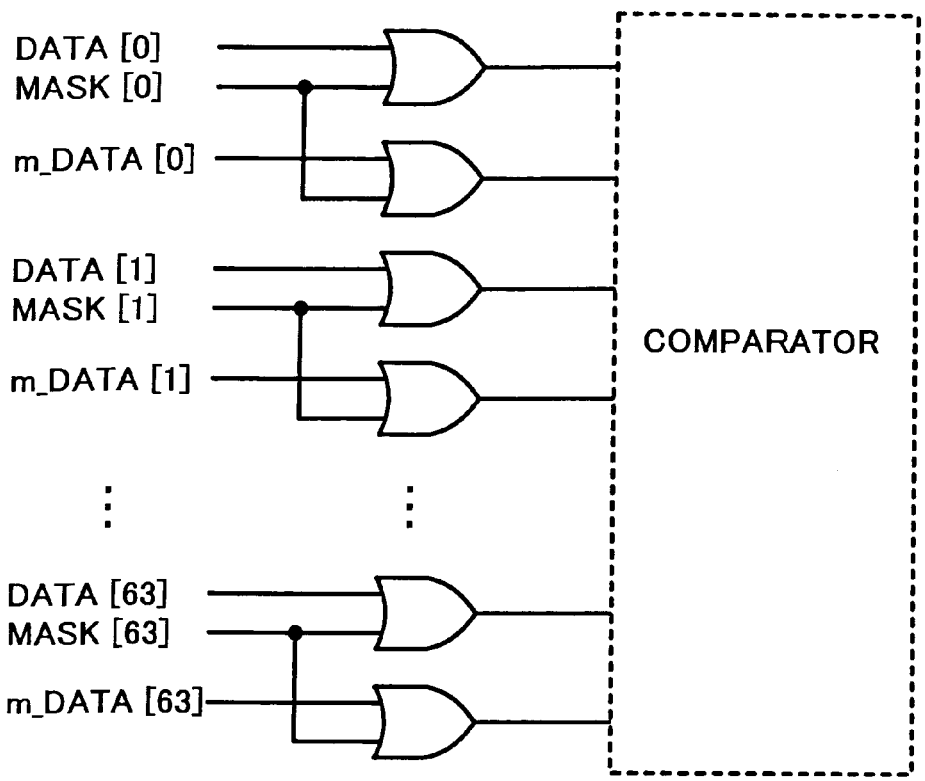
FIG. 13 is a schematic diagram illustrating an exemplary masking operation performed by any one of the inspecting systems of the present invention.

Before the comparisons, a bit mask shown in FIG. 13 may be applied to select the bits for comparison, while ignoring the other bits.

For example, if the bit mask of FIG. 13 is provided with an OR circuit, the bits for comparison are not masked. That is, when the bit mask has the value 0, the processed data and the reference data are input to the comparator, without changing their original bit values.

On the other hand, the bits to be ignored are masked. That is, when the bit mask has the value 1, the processed data and the reference data are both turned to 1. The masked processed data and reference data are input to the comparator, however, the actual comparison may not be carried out, since the masked data always match.

The bit mask may be previously set by the controller, or the host apparatus 601, using a masking register (not shown) provided in the inspecting apparatus.

Figure 14:
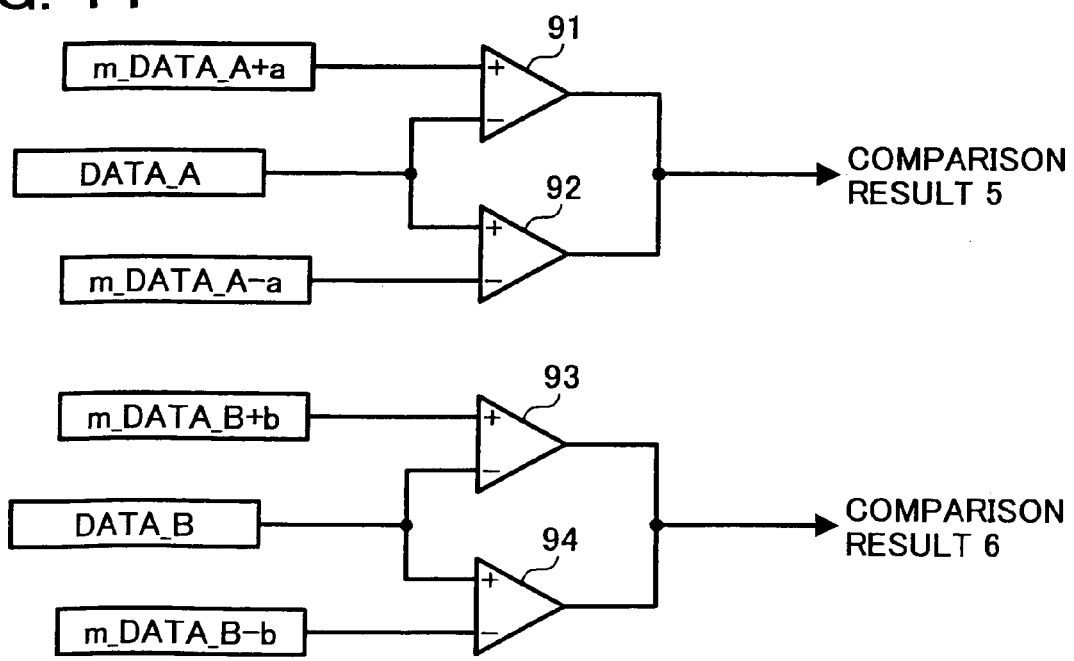
FIG. 14 is a schematic diagram illustrating another exemplary comparison operation performed by any one of the inspecting systems of the present invention.

FIG. 14 illustrates another exemplary structure of the comparator according to a preferred embodiment of the present invention.

The comparator of FIG. 14 includes differential comparing circuits 91, 92, 93, and 94, capable of correcting errors naturally caused in data transmissions or data conversions.

For example, if processed data DATA_A output from the inspected item varies from −2 to 2, such variance may be cancelled out by setting the differential value "a" of the comparing circuits 91 and 92 to a value greater than 2. The comparator can then compare the processed data DATA_A with reference data m_DATA_A, and generate a comparison result 5.

In the above-described case, the differential value may be defined by the controller or the host apparatus 601, according to the bit-width information. In other words, the comparator may previously store a number of differential values for a wide variety of bit-widths. In operation, the comparator may select a differential value corresponding to the bit-width information.

Numerous additional modifications and variations are possible in light of the above teachings. It is therefore to be understood that within the scope of the appended claims, the disclosure of this patent specification may be practiced otherwise than as specifically described herein.

For example, elements and/or features of different illustrative embodiments may be combined with each other and/or substituted for each other within the scope of this disclosure and appended claims.

Further, the present invention may be implemented by a programmable logic device, capable of providing the functions described above. Alternatively, the present invention may be implemented by ASIC (Application Specific Integrated Circuit), prepared by interconnecting an appropriate network of conventional component circuits or by a combination thereof with one or more conventional general purpose microprocessors and/or signal processors programmed accordingly.

The present invention thus also includes a computer-based product which may be hosted on a storage medium and include instructions which can be used to program a microprocessor to perform a process in accordance with the present invention. This storage medium can include any type of disk including floppy disks, optical disks, CD-ROMs, magneto-optical disks, ROMs, RAMs, EPROMs, EEPROMs, flash memory, magnetic or optical cards, or any type of media suitable for storing electronic instructions.

This patent specification is based on Japanese patent application, No. JPAP 2003-340381 filed on Sep. 30, 2003, in the Japanese Patent Office, the entire contents of which are hereby incorporated by reference herein.

What is claimed is:

1. An inspecting apparatus for inspecting acceptability of an item, comprising:

means for obtaining characteristic information of the item;

means for generating a test data set including one or more test data according to the characteristic information;

means for generating a reference data set including one or more reference data corresponding to the one or more test data;

means for storing the test data set in a first data area;

means for storing the reference data set in a second data area;

means for selecting test data from the test data set and the corresponding reference data from the reference data set;

means for outputting the test data to the item to cause the item to generate processed data;

means for storing the processed data in the third data area;

means for obtaining address information, indicating the location of the test data in the first data area, the location of the reference data in the first data area, and the location of the processed data in the first data area;

means for extracting the processed data and the reference data from the storage device with reference to the address information;

means for comparing the processed data and the reference data on the bit basis; and means for determine acceptability of the item based on the comparison.

2. The inspecting apparatus of claim 1, wherein the comparing means includes:

means for dividing the processed data into a number of processed data segments, with each segment containing one bit of processed data, before the comparison;

means for dividing the reference data into a number of reference data segments, with each segment containing one bit of the reference data, before the comparison; and means for selecting a target processed data segment, using the address information;

means for identifying a target reference data segment that corresponds to the target processed data segment, using the address information;

means for comparing the target processed data segment with the target reference data segment; and means for generating a data comparison result based on the comparison.

3. The inspecting apparatus of claim 2, wherein the selecting means includes:

means for masking out processed data segments other than the selected processed data segment.

4. The inspecting apparatus of claim 3, wherein the identifying means includes:

means for masking out reference data segments other than the selected reference data segment.

5. The inspecting apparatus of claim 2, wherein the comparing means further includes:

means for assigning a first value to the data comparison result, when the data comparison result indicates that the target processed data segment matches with the target reference data segment; and means for assigning a second value to the data comparison result, when the data comparison result indicates that the target processed data segment differs from the target reference data segment.

6. The inspecting apparatus of claim 5, wherein the comparing means further includes:
means for counting a number of the data comparison results assigned with the first value; and
means for storing the counted number as an error number.

7. The inspecting apparatus of claim 6, wherein the comparing means further includes:
means for determining the acceptability of the item based on the error number.

8. The inspecting apparatus of claim 7, wherein the determining means determines that the item is defective when the error number exceeds a predetermined value, and that the item is acceptable when the error number is equal to or below the predetermined value.

9. The inspecting apparatus of claim 8, wherein the predetermined value is previously defined by the obtaining means.

10. The inspecting apparatus of claim 8, wherein the comparing means further includes:
means for setting a differential value, which specifies the predetermined value.

11. The inspecting apparatus of claim 8, wherein the comparing means further includes:
means for identifying the data comparison result assigned with the first value;
means for extracting an offset address of the processed data segment corresponding to the identifying data comparison result;
means for storing the offset address; and
means for identifying a portion of the item attributable to the defect.

12. The inspecting apparatus of claim 1, further comprising:
means for obtaining a bit-width on which the inspecting apparatus operates;
means for obtaining a bit-width on which the item operates;
means for comparing the bit-width of the inspecting apparatus with the bit-width of the item; and
means for generating bit-width information indicating the bit-width comparison result.

13. The inspecting apparatus of claim 12, wherein the obtaining means obtains the bit-width information as a part of the characteristic information.

14. The inspecting apparatus of claim 13, further comprising, when the comparison result indicates that the bit-width of the item is lower than the bit-width of the inspecting apparatus:
means for converting the test data from the bit-width of the inspecting apparatus to the bit-width of the item; and
means for converting the processed data from the bit-width of the item to the bit-width of the inspecting apparatus.

15. The inspecting apparatus of claim 13, wherein the comparing means includes:
means for dividing the processed data into a number of processed data segments, with each segment containing a number of bits of processed data, before the comparison;
means for dividing the reference data into a number of reference data segments, with each segment containing a number of bits of the reference data, before the comparison; and
means for selecting a target processed bit-data segment, using the address information;
means for identifying a target reference data segment that corresponds to the target processed data segment, using the address information;
means for comparing the target processed data segment with the target reference data segment; and
means for generating a data comparison result based on the comparison.

16. The inspecting apparatus of claim 15, wherein the number of bits of processed data contained in the processed data segments and the number of bits of reference data contained in the reference data segments are made identical with each other according to the bit-width information.

17. The inspecting apparatus of claim 16, wherein the selecting means includes:
means for masking out processed data segments other than the selected processed data segment.

18. The inspecting apparatus of claim 17, wherein the identifying means includes:
means for masking out reference data segments other than the selected reference data segment.

19. The inspecting apparatus of claim 15, wherein the comparing means further includes:
means for assigning a first value to the data comparison result, when the comparison indicates that the target processed data segment matches with the target reference data segment; and
means for assigning a second value to the data comparison result, when the comparison indicates that the target processed data segment differs from the target reference data segment.

20. The inspecting apparatus of claim 19, wherein the comparing means further includes:
means for counting a number of the data comparison results assigned with the first value; and
means for storing the counted number as an error number.

21. The inspecting apparatus of claim 20, wherein the comparing means further includes:
means for determining the acceptability of the item based on the error number.

22. The inspecting apparatus of claim 21, wherein the determining means determines that the item is defective when the error number exceeds a predetermined value, and that the item is acceptable when the error number is equal to or below the predetermined value.

23. The inspecting apparatus of claim 22, wherein the predetermined value is previously defined by the obtaining means.

24. The inspecting apparatus of claim 22, wherein the comparing means further includes:
means for setting a differential value, which specifies the predetermined value.

25. The inspecting apparatus of claim 22, wherein the comparing means further includes:
means for identifying the data comparison result assigned with the first value;
means for extracting an offset address of the processed data segment corresponding to the identifying data comparison result;
means for storing the offset address; and
means for identifying a portion of the item attributable to the defect.

26. An inspecting system, comprising:
a target circuit board containing characteristic information; and
an inspecting apparatus connected to the target circuit board and configured to inspect acceptability of the target circuit board, wherein the inspecting apparatus includes:
  a controller configured to provide a test data set including at least one test data and a reference data set including at least one reference data, which are generated according to the characteristic information of the target circuit board;
  a storage device having a first data area, a second data area, and a third data area;
  a test data input device configured to extract the test data from the controller and store the test data in the first data area of the storage device;
  a reference data input device configured to extract the reference data from the controller and store the reference data in the second data area of the storage device;
  a test data output device configured to extract the test data from the first area of the storage device, output the test data to the target circuit board, and cause the target circuit board to generate processed data from the test data;
  a processed data input device configured to receive the processed data from the target circuit board and store the processed data in the third data area of the storage device;
  an address manager configured to store address information indicating a location of the test data in the first data area, a location of the reference data in the second data area, and a location of the processed data in the third data area; and
  a data comparator configured to extract the processed data and the reference data from the storage device with reference to the address information, compare the processed data and the reference data on the bit basis, and determine acceptability of the target circuit board based on the comparison.

27. The inspecting system of claim 26, further comprising a host apparatus connected to the inspecting apparatus via a network.

28. The inspection system of claim 27, wherein the host apparatus includes:
  a processor; and
  a host storage device configured to store a plurality of instructions which, when executed by the processor, cause the processor to perform a programmed operation including:
  obtaining the characteristic information of the target circuit board;
  generating the test data set according to the characteristic information and the reference data set corresponding the test data set; and
  sending the test data set and the reference data set to the inspecting apparatus as a data file.

29. The inspecting system of claim 28, wherein the programmed operation further includes:
  obtaining a first bit-width value, indicating a number of bit-widths on which the target circuit operates; and
  obtaining a second bit-width value, indicating a number of bit-widths on which the inspecting apparatus operates.

30. The inspecting system of claim 29, wherein the data comparator divides the processed data into a predetermined number of processed data segment, and the reference data into the predetermined number of reference data segments, before the comparison.

31. The inspecting system of claim 30, wherein the programmed operation further includes:
  defining the predetermined number according to the relationship between the first bit-width value and the second bit-width value.

32. The inspecting system of claim 29, wherein the test data output device includes:
  a first converter configured to convert the test data from the first bit-width value to the second bit-width value, when the second bit-width value is lower than the first bit-width value; and
  a second converter configured to convert the processed data from the second bit-width value to the first bit-width value, when the second bit-width value is lower than the first bit-width value.

33. The inspecting system of claim 28, wherein the host apparatus further includes:
  a display device configured to display various information, including the data file generated by the processor and the comparison result generated by the inspecting apparatus.

34. The inspecting system of claim 33, wherein the host apparatus further includes:
  an input device configured to input commands to the processor.

35. The inspecting system of claim 26, further comprising:
  a master circuit board having a first terminal connected to the first data area and a second terminal connected to the second data area, configured to store the test data and the reference data in the first data area and in the second data area, respectively, via the controller.

36. The inspecting system of claim 35, wherein the target circuit board has an image processing function, and the master circuit board includes an image processor section to be incorporated in an image forming apparatus.

37. The inspecting system of claim 35, wherein the target circuit board has a scanning function, and the master circuit board includes a scanner section to be incorporated in an image forming apparatus.

38. The inspecting system of claim 37, further comprising:
  a first analog/digital converter interposed between the first terminal of the master circuit board and the first data area and configured to convert the test data from digital to analog before the storing operation; and
  a digital/analog converter interposed between the first data area and the target circuit board and configured to convert the test data from digital to analog before the outputting operation.

39. The inspecting system of claim 35, wherein the target circuit board has a printing function, and the master circuit board includes a printer section to be incorporated in an image forming apparatus.

40. The inspecting system of claim 39, further comprising:
  a second analog/digital converter interposed between the second terminal of the master circuit board and the second data area and configured to convert the reference data from analog to digital before the storing operation; and
  a third analog/digital converter interposed between the third data area and the target circuit board and configured to convert the processed data from analog to digital before the storing operation.

41. A method for inspecting an item, comprising the steps of:
  obtaining characteristic information of the item;
  generating a test data set including one or more test data according to the characteristic information;
  generating a reference data set including one or more reference data corresponding to the one or more test data;
  storing the test data set in a first data area and the reference data set in a second data area, respectively;
  generating address information, including information regarding the respective locations of the test data in the first data area, and the respective locations of the reference data in the second data area;
  selecting test data from the test data set and the corresponding reference data from the reference data set, using the address information;
  outputting the test data to the item;
  generating processed data from the test data, using the item;
  storing the processed data in a third area;
  adding information regarding the location of the processed data in the third area to the address information;
  extracting the processed data from the third area and the reference data from the second area, using the address information;
  comparing the processed data with the reference data, on the bit basis; and
  determining acceptability of the item based on the comparison result.

42. The method of claim 41, further comprising the steps of:
  obtaining a bit-width on which the inspecting apparatus operates;
  obtaining a bit-width on which the item operates;
  comparing the bit-width of the inspecting apparatus with the bit-width of the item; and
  generating bit-width information indicating the bit-width comparison result.

43. The method of claim 42, wherein the comparison result indicates that the bit-width of the item is lower than the bit-width of the inspecting apparatus.

44. The method of claim 43, further comprising the steps of:
  converting the test data from the bit-width of the inspecting apparatus to the bit-width of the item; and
  converting the processed data from the bit-width of the item to the bit-width of the inspecting apparatus.

45. The method of claim 42, further comprising the steps of:
  dividing the processed data into a number of processed data segments, with each segment containing a number of bits of processed data, before the comparison;
  dividing the reference data into a number of reference data segments, with each segment containing a number of bits of the reference data, before the comparison; and
  selecting a target processed bit-data segment, using the address information;
  identifying a target reference data segment that corresponds to the target processed data segment, using the address information;
  comparing the target processed data segment with the target reference data segment; and
  generating a data comparison result based on the comparison.

46. The method of claim 45, wherein the number of bits of processed data contained in the processed data segments and the number of bits of reference data contained in the reference data segments are made identical with each other according to the bit-width information.

47. The method of claim 46, further comprising the step of:
  masking out processed data segments other than the selected processed data segment.

48. The method of claim 47, further comprising the step of:
  masking out reference data segments other than the selected reference data segment.

49. The method of claim 45, further comprising the steps of:
  assigning a first value to the data comparison result, when the comparison indicates that the target processed data segment matches with the target reference data segment; and
  assigning a second value to the data comparison result, when the comparison indicates that the target processed data segment differs from the target reference data segment.

50. The method of claim 49, further comprising the steps of:
  counting a number of the data comparison results assigned with the first value; and
  storing the counted number as an error number.

51. The method of claim 50, further comprising the step of:
  determining the acceptability of the item based on the error number.

52. The method of claim 51, further comprising the steps of:
  determining that the item is defective when the error number exceeds a predetermined value; and
  determining that the item is acceptable when the error number is equal to or below the predetermined value.

53. The method of claim 52, wherein the predetermined value is previously set.

54. The method of claim 52, further comprising the step of:
  setting a differential value, which specifies the predetermined value.

55. The method of claim 52, further comprising the steps of:
  identifying the data comparison result assigned with the first value;
  extracting an offset address of the processed data segment corresponding to the identifying data comparison result;
  storing the offset address; and
  identifying a portion of the item attributable to the defect.

56. A computer program product stored on a computer readable storage medium for carrying out a method, when run on an apparatus, the method comprising the steps of:
  obtaining characteristic information of an item;
  generating a test data set including one or more test data according to the characteristic information;
  generating a reference data set including one or more reference data corresponding to the one or more test data;
  storing the test data set in a first data area and the reference data set in a second data area, respectively;
  generating address information, including information regarding the respective locations of the test data in the first data area, and the respective locations of the reference data in the second data area;

selecting test data from the test data set and the corresponding reference data from the reference data set, using the address information;
outputting the test data to the item;
generating processed data from the test data, using the item;
storing the processed data in a third area;
adding information regarding the location of the processed data in the third area to the address information;
extracting the processed data from the third area and the reference data from the second area, using the address information;
comparing the processed data with the reference data, on the bit basis; and
determining acceptability of the item based on the comparison result.

57. The product of claim 56, wherein the method further comprises the steps of:
obtaining a bit-width on which the inspecting apparatus operates;
obtaining a bit-width on which the item operates;
converting the test data from the bit-width of the inspecting apparatus to the bit-width of the item; and
converting the processed data from the bit-width of the item to the bit-width of the inspecting apparatus.

58. The product of claim 57, wherein the method further comprises the steps of:
dividing the processed data into a number of processed data segments, with each segment containing a number of bits of processed data, before the comparison;
dividing the reference data into a number of reference data segments, with each segment containing a number of bits of the reference data, before the comparison; and
selecting a target processed bit-data segment, using the address information;
identifying a target reference data segment that corresponds to the target processed data segment, using the address information;
comparing the target processed data segment with the target reference data segment; and
generating a data comparison result based on the comparison to be used for the comparison.

59. A computer readable medium storing computer instructions for performing a method, the method comprising the steps of:
obtaining characteristic information of an item;
generating a test data set including one or more test data according to the characteristic information;
generating a reference data set including one or more reference data corresponding to the one or more test data;
storing the test data set in a first data area and the reference data set in a second data area, respectively;
generating address information, including information regarding the respective locations of the test data in the first data area, and the respective locations of the reference data in the second data area;
selecting test data from the test data set and the corresponding reference data from the reference data set, using the address information;
outputting the test data to the item;
generating processed data from the test data, using the item;
storing the processed data in a third area;
adding information regarding the location of the processed data in the third area to the address information;
extracting the processed data from the third area and the reference data from the second area, using the address information;
comparing the processed data with the reference data, on the bit basis; and
determining acceptability of the item based on the comparison result.

60. The medium of claim 59, wherein the method further comprises the steps of:
obtaining a bit-width on which the inspecting apparatus operates;
obtaining a bit-width on which the item operates;
converting the test data from the bit-width of the inspecting apparatus to the bit-width of the item; and
converting the processed data from the bit-width of the item to the bit-width of the inspecting apparatus.

61. The medium of claim 60, wherein the method further comprises the steps of:
dividing the processed data into a number of processed data segments, with each segment containing a number of bits of processed data, before the comparison;
dividing the reference data into a number of reference data segments, with each segment containing a number of bits of the reference data, before the comparison; and
selecting a target processed bit-data segment, using the address information;
identifying a target reference data segment that corresponds to the target processed data segment, using the address information;
comparing the target processed data segment with the target reference data segment; and
generating a data comparison result based on the comparison to be used for the comparison.

* * * * *